US006821905B2

(12) United States Patent
Pan et al.

(10) Patent No.: US 6,821,905 B2
(45) Date of Patent: Nov. 23, 2004

(54) METHOD FOR AVOIDING CARBON AND NITROGEN CONTAMINATION OF A DIELECTRIC INSULATING LAYER

(75) Inventors: Shing-Chyang Pan, Tainan (TW); Shwang-Ming Jeng, Hsin-chu (TW); Chen-Hua Yu, Hsin-chu (TW); Grace H. Ho, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 159 days.

(21) Appl. No.: 10/209,466

(22) Filed: Jul. 30, 2002

(65) Prior Publication Data

US 2004/0023497 A1 Feb. 5, 2004

(51) Int. Cl.[7] .............................................. H01L 21/302
(52) U.S. Cl. ........................ 438/706; 438/710; 438/714; 216/67

(58) Field of Search ................................. 438/706, 710, 438/712, 714, 720; 216/58, 67

(56) References Cited

U.S. PATENT DOCUMENTS

| 6,028,015 | A  | * | 2/2000  | Wang et al. ................ 438/789 |
| 6,465,358 | B1 | * | 10/2002 | Nashner et al. ............. 438/700 |
| 6,548,396 | B2 | * | 4/2003  | Naik et al. .................. 438/622 |
| 6,583,046 | B1 | * | 6/2003  | Okada et al. ................ 438/622 |

* cited by examiner

Primary Examiner—Lan Vinh
(74) Attorney, Agent, or Firm—Tung & Associates

(57) ABSTRACT

A method for preventing carbon and nitrogen penetration from a deposited overlayer into a dielectric insulating layer to improve a subsequent photolithographic patterning and anisotropic etching process including providing a semiconductor wafer having a process surface including an exposed dielectric insulating layer; and, subjecting the dielectric insulating layer to a hydrogen containing plasma treatment to form a penetration resistance to one of nitrogen containing and carbon containing species.

25 Claims, 2 Drawing Sheets

METHOD FOR AVOIDING CARBON AND NITROGEN CONTAMINATION OF A DIELECTRIC INSULATING LAYER

FIELD OF THE INVENTION

This invention generally relates, to photolithographic patterning and anisotropic etching of semiconductor features and more particularly to an improved method for manufacturing semiconductor features including bottom anti-reflective coating (BARC) layers over low-k dielectric insulating layers to prevent the formation of undeveloped photoresist and the phenomenon of etching stop during anisotropic etching.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the stringent requirements placed on photolithographic processes. One recurring problem in photolithography, especially with porous low dielectric constant (low-k) dielectric insulating materials, is photoresist poisoning caused by residual nitrogen containing species interfering with photoresist exposure and development processes.

In the fabrication of semiconductor devices multiple levels may be required for providing a multi-level interconnect structure. During the manufacture of integrated circuits it is common to place material photoresist on top of a semiconductor wafer in desired patterns and to anisotropically etch away or otherwise remove surrounding material not covered by the resist pattern in order to produce metal interconnect lines or other desired features. For example, during the formation of multi-level semiconductor devices the various levels must be electrically interconnected through and within a device level. Electrical interconnects are typically formed by anisotropically etching openings in a dielectric insulating layer an filling them with metal to form electrically interconnecting lines. For example, vias extend through an insulating layer to electrically interconnect levels of a device while trench lines, in turn electrically connected to vias, electrically interconnect the various portion of a device within a device level. The damascene process is a well known semiconductor fabrication method for forming electrical interconnects between and within levels by forming vias and trench lines.

For example, in an exemplary process for forming dual damascene structures, a via opening is first anisotropically etched in an insulating layer also known as an inter-metal dielectric (IMD) layer. The insulating layer is typically formed over a metal or conductive area including an overlying lining or etching stop layer. After a series of photolithographic and anisotropic etching steps forming a respective via opening and overlying trench opening encompassing the via opening, the via opening and the trench opening are filled with a metal (e.g., Al, Cu) to form via and trench line portions of a dual damascene structure. The excess metal above the trench level is then removed by well known chemical-mechanical polishing (CMP) processes.

As feature sizes in anisotropic etching process have diminished, photolithographic patterning processes require activating light (radiation) of increasingly smaller wavelength. For 0.25 micron and below CMOS technology, deep ultraviolet (DUV) photoresists have become necessary to achieve the desired resolution. Typically DUV photoresists are activated with activating light source wavelengths of less than about 250 nm, for example, commonly used wavelengths include 193 nm and 248 nm. Many DUV photoresists are chemically amplified using a photoacid generator activated by the light source to make an exposed area soluble in the development process.

One problem affecting DUV photoresist processes as been the interference of residual nitrogen-containing species, for example amines, with the DUV photoresist. Residual nitrogen-containing contamination is one of the greater concerns in the use of metal nitride layers such as silicon oxynitride which is commonly used as a bottom-anti-reflective coating (BARC) also referred to as a dielectric anti-reflective coating (DARC). Metal nitride layers, such as silicon oxynitride and silicon nitride are also frequently used as etching stop layers. The nitride layers are frequently formed by CVD processes using amine and amide containing precursors which tend to diffuse into adjacent porous layers of dielectric insulating layers. For example, the increasing use of low-k dielectric materials, typically having a high degree of porosity, facilitates absorption and transport of contaminating chemical species. For example, it is believed that nitrogen radicals created due to the presence of nitrogen containing species, such as amines and amides, interfere with chemically amplified DUV photoresists by neutralizing the acid catalyst, thereby rendering the contaminated portion of the photoresist insoluble in the developer. As a result, residual photoresist may remain on patterned feature edges, sidewalls, or floors of features, affecting subsequent etching or metal filling processes leading to, for example, electrical open circuits or increased resistivity.

Approaches to prevent the diffusion of contaminating nitrogen containing species from overlying etching stop or BARC layers including for example silicon oxynitride, include forming a silicon dioxide layer over the low dielectric constant IMD layer prior to forming the etching stop or BARC layers. A shortcoming of this approach is the added stresses applied to the IMD layer and the added contribution to the overall capacitance of the multi-level semiconductor device.

Another approach has been to use a carbon based BARC's, thereby avoiding the presence of nitrogen contaminating species. A shortcoming of this approach is that a carbon based BARC during anisotropic etching contributes to the formation of polymer residues on the sidewalls and bottoms of the etched feature frequently slowing the etching rate within the feature, also referred to as etch stop phenomena.

The key mechanisms responsible for achieving high aspect ratio anisotropic etching with a high etching selectivity involves the combination several factors including the deposition of nonvolatile residue, e.g., a polymeric carbon containing residue on various etching surfaces during the etching process acting to slow the relative etching rate on those surfaces If the formation of polymeric residual species proceeds at too high a rate, a condition often referred to as "etch stop" or aspect ratio dependent etching (ARDE) occurs with respect to high aspect ratio features, such as contact holes and vias. For example, during the etching of a contact hole or via, a nonvolatile polymeric residual layer may be formed on the sidewalls and bottom surface of the contact hole or via from carbon containing neutral species resulting from the etch process. The carbon for forming the polymeric residue may originate from hydrofluorocarbons used in the etching process, for example, carbon-rich hydrofluorocarbons or the etching target material such as the IMD layer and carbon based BARC's. Deposition of the polymeric residue and etching of the oxide layer occur simultaneously. When high aspect ratio features are etched, the etch rate and etch chemistry vary with the aspect ratio and etching depth of the feature. Often the etching process begins normally until the etched hole reaches a particular depth or aspect ratio at which point the etching process undesirably stops due to excess deposition of polymeric residue within the etched feature, i.e., "etching stop" phenomenon.

The use of carbon based BARC's exacerbates the problem of etching stop especially in areas where there are a few or isolated contact holes or vias. Complex chemistry equilibria in the etching chemistry are believed to be responsible or the sensitivity of high aspect ratio single or isolated anisotropically etched openings. For example, a higher concentration of carbon species at steady state is believed to exist locally over areas where there is a low density of openings being etched thereby increasing the rate of polymer formation and deposition within the etched feature.

There is therefore a need to develop a method whereby reliable anisotropic etching processes may be carried out in the presence of nitrogen and carbon based BARC's including preventing the formation of undeveloped photoresist residue and etching stop.

It is therefore an object of the invention to provide a method whereby reliable anisotropic etching processes may be carried out in the presence of nitrogen and carbon based BARC's including preventing the formation of undeveloped photoresist residue and etching stop while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for preventing carbon and nitrogen penetration from a deposited overlayer into a dielectric insulating layer to improve a subsequent photolithographic patterning and anisotropic etching process.

In a first embodiment, the method includes providing a semiconductor wafer having a process surface including an exposed dielectric insulating layer; and, subjecting the dielectric insulating layer to a hydrogen containing plasma treatment to form a penetration resistance to one of nitrogen containing and carbon containing species.

These and other embodiments, aspects and features of the invention will become better understood from a detailed description of the preferred embodiments of the invention which are described below in conjunction with the accompanying drawings.

DETAILED DESCRIPTION OF THE PREFERRED EMBODIMENTS

Although the present invention is explained with reference to a via etching process, for example, as a first step in forming a dual damascene structure, it will be appreciated that the present invention may be adapted to the formation of any anisotropically etched semiconductor feature, where incorporation of carbon or nitrogen species into a dielectric insulating layer may be reduced or prevented using a nitrogen or carbon containing bottom anti-reflective coating (BARC) to improve a subsequent photolithographic patterning and anisotropic etching process to avoid the formation of undeveloped photoresist and etch stop phenomena.

Figure 1A:
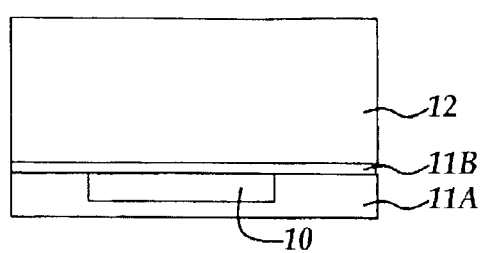
FIGS. 1A–1F are representative cross sectional side views of a portion of a semiconductor wafer including a dual damascene structure at stages in the manufacturing process according to an exemplary implementation of the present invention.

For example, in an exemplary embodiment, referring to FIGS. 1A–1F, are shown cross sectional side views of a portion of a multi-level semiconductor device at stages in manufacturing a dual damascene structure. Referring to FIG. 1A is shown is a conductive region 10, for example, copper, formed in a dielectric insulating layer 11A having an overlying etching stop layer 11B, for example silicon nitride or silicon carbide (SiC). The etching stop layer 11B is formed by a conventional chemical vapor deposition (CVD) process including for example, PECVD (plasma enhanced CVD), LPCVD (low pressure CVD), or HDPCVD (high density plasma CVD) having a thickness of about 200 Angstroms to about 1000 Angstroms. It will be appreciated that the method of the present invention including the hydrogen plasma treatment may be applied to each dielectric insulating layer including 11A prior to the deposition of the etching stop layer, but is detailed with reference to the subsequently formed overlying dielectric insulating layer 12 as outlined below.

Still referring to FIG. 1A, formed over etching stop layer 11B is dielectric insulating layer 12 also referred to as an inter-metal dielectric (IMD) or inter-layer dielectric (ILD) layer formed of, for example, a low-k (low dielectric constant) silicon oxide based material. In one embodiment, the dielectric insulating layer is preferably formed of one of carbon doped oxide (C-oxide), organo-silicate glass (OSG), undoped silicate glass (USG), and fluorinated silicate glass (FSG). In another embodiment, the dielectric insulating layer is a carbon doped oxide formed by a plasma assisted CVD process, for example PECVD or HDP-CVD, using organo-silane and/or organo-siloxane precursors. For example, organo-silane precursors include Si—Si—$R_y$, groups, where R is an alkyl or cyclo-alkyl group and y the number of R groups bonded to silicon. Organo-siloxane precursors include Si—O groups. In another embodiment, the precursor is an organo-siloxane precursor including a cyclo-tetra-siloxane groups including a cyclic ring arrangement of four Si—O groups with alkyl or cyclo-alkyl groups, for example methyl groups, attached to silicon atoms in the cyclo-siloxane ring. In a preferred embodiment, the IMD layer is formed to include at least one of octa-methyl-cyclo-tetra-siloxane and tetra-methyl-cyclo-tetra-siloxane groups. Typically, the IMD layer is formed having a thickness of about 3000 to about 10,000 Angstroms.

Following deposition of the IMD layer 12, according to the present invention, the IMD layer is subjected to a hydrogen plasma treatment. The plasma process for carrying out the hydrogen plasma treatment may include any conventional plasma reactor configuration and plasma source including high density, medium density and low density plasmas. For example, for a high density plasma (HDP), the plasma source may include an electron-cyclotron-resonance (ECR) source, a helicon plasma source, an inductively coupled plasma (ICP) source, a dual plasma source (DPS), or a magnetically enhanced RIE (MERIE).

In a preferred embodiment according to the present invention, the hydrogen plasma treatment is preferably carried out prior to the deposition of an overlying nitrogen or carbon based material layer, for example a BARC layer. By the term 'nitrogen based' is meant containing nitrogen including metal nitrides and metal oxynitrides, for example, example silicon nitride (e.g., SiN) and silicon oxynitride (e.g., SiON). By the term 'carbon-based' is meant containing carbon including metal carbides and metal oxycarbides, for example, silicon carbide (e.g., SiC) and silicon oxycarbide (e.g., SiOC). It is believed that the hydrogen plasma treatment according to preferred embodiments operates to at least partially fill (coordinate) coordinatively unsaturated siloxane (Si—O) bonds within the low-k IMD layer, thereby 'capping' or blocking potential implantation or bonding sites for carbon or nitrogen in a subsequent carbon based or nitrogen based BARC deposition. The hydrogen plasma treatment acts to block carbon and nitrogen from incorporating (penetrating) into the IMD layer at the hydrogen plasma treated upper surface and near surface areas of the IMD layer during subsequent deposition of one of a carbon based or nitrogen based BARC over the IMD layer. For example, silicon oxynitride and silicon oxycarbide are frequently use as BARC layers to reduce undesired light reflections in a subsequent photolithographic patterning process. As such, following the hydrogen plasma treatment, the level of implanted or incorporated carbon or nitrogen species into the IMD layer is reduced during subsequent deposition of a carbon or nitrogen based BARC.

Consequently, in the case a nitrogen based BARC layer is deposited, less nitrogen species are available for out-diffusion from the IMD layer during a subsequent photolithographic process to interfere with, for example, a DUV photoresist having a photoacid generator (PAG) or amplified photoresist. Therefore, nitrogen species interference or neutralization of a catalyzed development process, for example during a post exposure baking (PEB) process is reduced to prevent the formation of undeveloped photoresist on portions of the patterned feature. Further, if a carbon based BARC layer is subsequently deposited over the hydrogen plasma treated IMD layer, the incorporation of carbon into the IMD layer is reduced thereby reducing the amount of volatized carbon in a subsequent reactive ion etching (RIE) process to etch, for example, via openings. As a result, the deposition rate of polymeric material onto the bottom portion of the via is thereby reduced to avoid the phenomena of etch stop.

Figure 2:
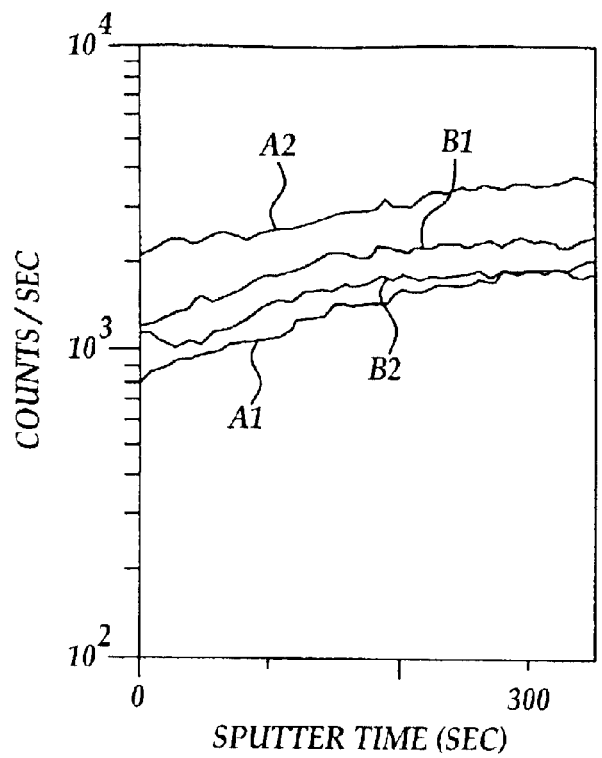
FIG. 2 is a graph of SIMS data reflecting relative hydrogen and nitrogen concentrations in an exemplary dielectric insulating layer before and following a hydrogen containing plasma treatment according to a preferred embodiment of the present invention.

For example, referring to FIG. 2, as detected with secondary ion Mass Spectroscopy (SIMS), it has been found that the hydrogen plasma treatment according to an exemplary embodiment both increases the hydrogen content of the IMD layer and reduces the residual nitrogen content remaining from depositing a metal nitride layer, for example, a silicon oxynitride layer. In FIG. 2 is shown a portion of SIMS measurement data carried out over a thickness portion of an IMD layer formed of carbon doped oxide having a metal nitride layer deposited over the IMD layer with and without a prior hydrogen plasma treatment. Represented on the vertical axis are counts per second (c/s) of detected species sputtered from the target surface (carbon doped oxide IMD layer), proportional to their respective relative concentrations, and on the horizontal axis, sputter time in seconds, proportional to a thickness of sputtered target material. For simplicity, only the detected hydrogen and nitrogen portions of the data are shown. Line A1 and line B1 represent the relative hydrogen and nitrogen concentrations, respectively, over a sputtered thickness of about 500 Angstroms of the carbon doped oxide IMD layer where an overlying metal nitride layer was deposited over the MD layer without a hydrogen plasma treatment. Line A2 and line B2 represent the relative hydrogen and nitrogen concentrations, respectively, over the same thickness of the IMD layer where a metal nitride layer was deposited following the hydrogen plasma treatment according to a preferred embodiment of the invention. It is seen that the hydrogen concentration is significantly increased by the hydrogen plasma treatment (line A2) while the nitrogen concentration (line B2) is significantly decreased following the hydrogen plasma treatment, thereby demonstrating that the hydrogen plasma treatment reduces the level of incorporation of nitrogen into the IMD layer during a subsequent deposition of a metal nitride, for example, silicon oxynitride.

In one embodiment, the hydrogen plasma treatment is a low pressure plasma treatment. By the term 'low pressure' is meant including plasmas with a pressure of about 1 milliTorr to about 100 milliTorr. For example, in one embodiment, the hydrogen plasma treatment is preferably carried out at a pressure of from about 1 milliTorr to about 50 milliTorr, more preferably from about 3 milliTorr to about 10 milliTorr. The hydrogen plasma treatment optionally includes preheating the substrate (process wafer) to about 300° C. to about 400° C., more preferably about 350° C. A plasma source gas, pre-mixed or separately fed, is supplied to form and maintain the hydrogen containing plasma including about 5 percent to about 20 percent hydrogen ($H_2$) by volume with respect to the total volume of the plasma source gas with the remaining portion of the total volume an inert gas, for example, helium, argon, or mixtures thereof. The hydrogen plasma is maintained by applying an RF power level of about 200 Watts to about 600 Watts. An RF bias power is preferably applied to the wafer substrate at about 100 Watts to about 400 Watts to accelerate hydrogen bombardment and assist hydrogen penetration to cap coordinatively unsaturated siloxane bonds. The hydrogen plasma treatment is preferably carried out for a period of about 20 seconds to about 200 seconds, most preferably about 60 to about 180 seconds. In one embodiment, the RF and bias power are preferably adjusted such that a negative DC self-bias at the wafer surface is about −150 to about −250 Volts to increase the hydrogen ion bombardment energy.

In another embodiment, the hydrogen plasma treatment is a high pressure hydrogen plasma treatment. A high pressure plasma is created by RF glow discharge as is known in the art. By use of the term 'high pressure' is meant including process pressures from about 100 milliTorr to about 10 Torr. For example, barrel reactors or a helicon resonant wave reactor may be used to form high pressure plasmas. The hydrogen plasma treatment is preferably carried out with the substrate temperature being from about 0° C. to about 450° C., more preferably, about 350° C. to about 400° C. Preferably the substrate (process wafer) is preheated prior to the hydrogen plasma treatment. In one embodiment, the plasma source gas is added to a plasma chamber at a flow rate from about 100 to about 1000 sccm, more preferably, about 400 to about 700 sccm, most preferably about 600 sccm, at a process pressure from about 100 milliTorr to about 10 Torr, more preferably, about 100 milliTorr to about 5 Torr. The hydrogen plasma treatment is carried out for a period of about 20 seconds to about 200 seconds, most preferably about 60 to about 180 seconds at an RF power of about 100 to about 500 Watts. It is believed higher plasma pressures together with a preheated substrate aide the hydrogen to diffuse at higher rates into the IMD layer including near surface regions thereby increasing the thickness over which the hydrogen penetrates. Optionally, an RF bias is preferably applied to the wafer substrate at about 100 Watts to about 400 Watts to further aid hydrogen penetration.

Figure 1B:
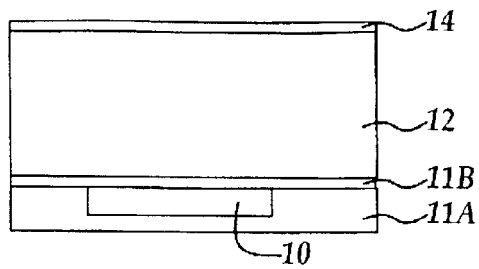

Referring to FIG. 1B, following the hydrogen plasma treatment, BARC layer 14, for example silicon oxynitride or silicon oxycarbide is deposited to reduce undesired light reflections in subsequent photolithographic patterning processes. It will be appreciated that the BARC layer 14 may be formed of an organic or inorganic carbon containing material. For example, an organic BARC may be formed from a plasma assisted CVD process including hydrocarbons and halohydrocarbons. More preferably, the BARC layer is formed of one of silicon oxycarbide or silicon oxynitride formed by a plasma assisted chemical vapor deposition (CVD) process including for example, PECVD (plasma enhanced CVD), LPCVD (low pressure CVD), or HDPCVD (high density plasma CVD). The BARC layer 14 is preferably formed having a thickness of about 500 to about 1200 Angstroms.

Figure 1C:
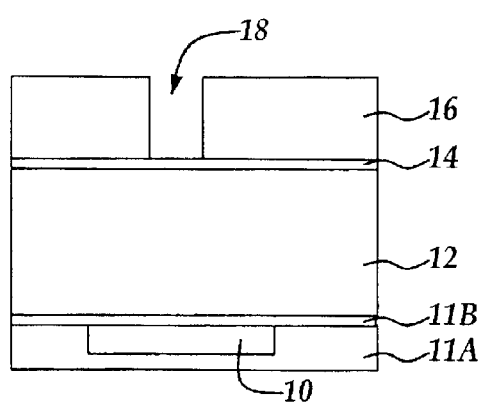

Referring to FIG. 1C, a photoresist layer 16 is next deposited over the BARC layer 14 and exposed and developed according to a conventional photolithographic patterning process to form an anisotropic etching pattern for high aspect ratio via openings, for example, via opening pattern 18. By the term high aspect ratio via openings is meant an aspect ratio of at least about 3:1. For example, vias having aspect ratios of about 4:1 are particularly susceptible to etch stop where excess carbon is present. For example, the method of the present invention is particularly effective in preventing etch stop where high aspect ratio vias have a lower surface density, for example isolated or single vias, where a locally higher concentration of carbon from etching processes may accumulate. Preferably, a deep ultraviolet chemically amplified (DUV) photoresist is used for patterning the via openings including an activating radiation source with a wavelength of less than about 250 nm, for example, from about 193 nm to about 250 nm, to expose the photoresist layer 16. The photoresist layer 16 may be any conventional DUV photoresist layer including a multi-layered photoresist including, for example, a chemically amplified resist producing a photogenerated acid. There are several suitable commercially available DUV photoresists known in the art.

Figure 1D:
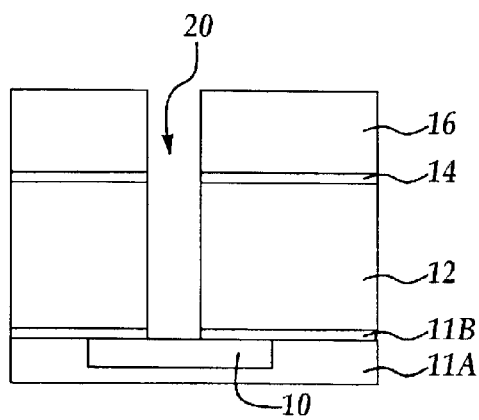

Still referring to FIG. 1D, via opening 20 is anisotropically etched through the thickness of the BARC layer 14, the IMD layer 12, and the etching stop layer 11B to create via opening 20 in closed communication with underlying conductive region 10. The anisotropic etching is carried out by conventional plasma reactive ion etch (RIE) processes including for example, mixtures of hydro-fluorocarbons, fluorocarbons, oxygen, and nitrogen. The photoresist layer 16 is then typically removed according to an oxygen plasma ashing process.

Figure 1E:
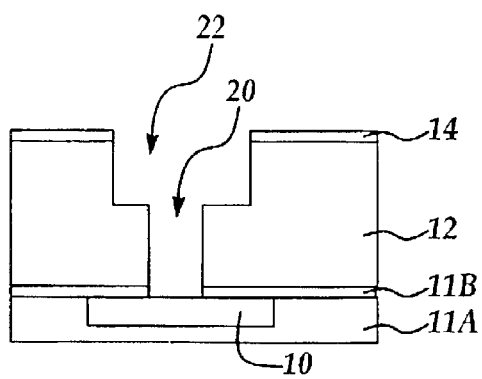

Referring to FIG. 1E, a similar second photolithographic patterning process is then carried out to pattern a trench opening overlying and encompassing the via opening 20. A conventional RIE process is then carried out to anisotropically etch trench opening 22 overlying and encompassing the via opening 20 forming a dual damascene structure. In one approach a via plug (not shown) of resinous material, for example a convention I-line novolak resin is formed to partially fill the via opening by a conventional spin-on and etchback process prior to anisotropically etching the trench opening.

Figure 1F:
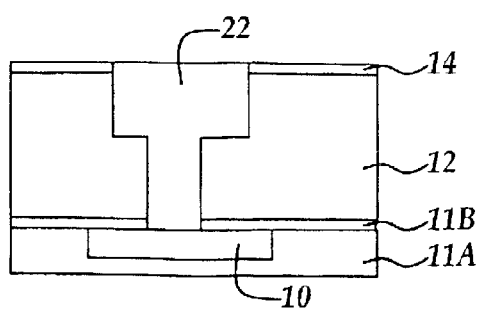

Referring to FIG. 1F, following formation and cleaning of the dual damascene structure to remove residual organic material, the dual damascene structure is filled with metal, for example, copper filling 24, according to an electrodeposition process followed by a CMP process to remove excess copper above the trench opening to complete the formation of a dual damascene. Prior to electrodeposition of copper filling 24, a barrier/adhesion layer (not shown) of for example, tantalum nitride, is blanket deposited to line the dual damascene structure, followed by deposition of a copper seed layer (not shown) over the wafer surface including the barrier/adhesion layer 26. During the CMP process the barrier/adhesion layer 26 and a portion of the BARC layer 14 at the wafer surface is polished away.

Figure 3:
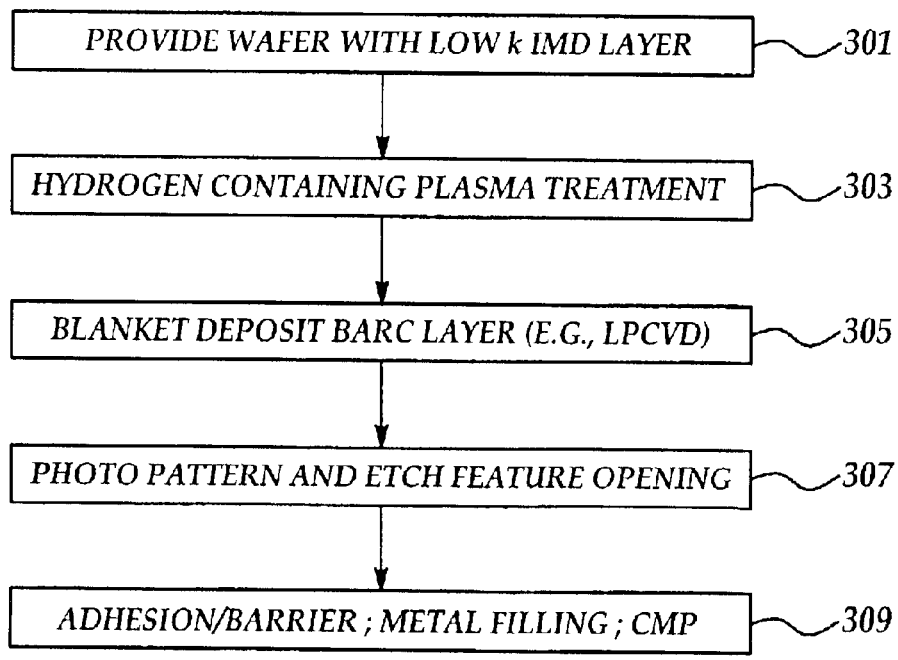
FIG. 3 is an exemplary process flow diagram including several embodiments of the present invention.

Referring to FIG. 3 is shown a process flow diagram including several embodiments of the present invention. In process 301, a semiconductor wafer process surface is provided for forming a dielectric insulating layer thereover. Preferably, a low-k dielectric insulating layer is deposited including coordinately unsaturated siloxane bonds, for example, formed by a plasma assisted CVD process including organo-silane and/or organo-siloxane precursors according to preferred embodiments. In process 303, a hydrogen containing plasma treatment according to preferred embodiments is carried out to at least partially fill coordinatively unsaturated siloxane bonds at a surface and near surface region of an upper portion of the dielectric insulating layer. In process 305 one of a nitrogen and carbon based BARC layer, for example silicon oxynitride and silicon oxycarbide, is deposited by a plasma assisted CVD process over the dielectric insulating layer. In process 307, a dual damascene structure is created including steps of anisotropically etching via and trench lines. In process 309 several subsequent processes are carried out including lining the dual damascene structure with an adhesion/barrier layer and filling the dual damascene structure with metal, preferably copper, followed by a CMP planarization process to complete the formation of the dual damascene.

The preferred embodiments, aspects, and features of the invention having been described, it will be apparent to those skilled in the art that numerous variations, modifications, and substitutions may be made without departing from the spirit of the invention as herein disclosed and more particularly claimed below.

What is claimed is:

1. A method for preventing carbon and nitrogen penetration from a deposited material overlayer into a dielectric insulating layer to improve a subsequent photolithographic patterning and anisotropic etching process comprising the steps of:

providing a semiconductor wafer having a process surface comprising an exposed dielectric insulating layer prior to forming an opening therein;

subjecting the dielectric insulating layer to a hydrogen containing plasma treatment to form a penetration resistance to one of nitrogen containing and carbon containing species comprising a subsequently deposited material layer;

depositing the material layer selected from the group consisting of a nitrogen containing material layer and carbon containing material layer on the dielectric insulating layer;

forming a patterned photoresist layer overlying the material layer; and, etching according to the patterned photoresist layer the opening in the dielectric insulating layer.

2. The method of claim 1, wherein the dielectric insulating layer comprises a material selected from the group consisting of carbon doped oxide (C-oxide), organo-silicate glass (OSG), undoped silicate glass (USG), and fluorinated silicate glass (FSG).

3. The method of claim 1, wherein the step of forming a patterned photoresist layer comprises the use of a chemically amplified photoresist comprising a photogenerated acid.

4. The method of claim 1, wherein the hydrogen containing plasma treatment comprises operating pressures from about 1 milliTorr to about 100 milliTorr.

5. The method of claim 1, wherein the hydrogen containing plasma treatment comprises applying an RF power of about 100 Watts to about 500 Watts to maintain the hydrogen plasma.

6. The method of claim 1, wherein the hydrogen containing plasma treatment comprises applying one of an AC and DC bias to the semiconductor wafer having a power of about 100 Watts to about 400 Watts.

7. The method of claim 1, wherein the hydrogen containing plasma treatment comprises operating pressures from about 100 milliTorr to about 10 Torr.

8. The method of claim 1, wherein the hydrogen containing plasma treatment comprises supplying a plasma source gas comprising about 5 percent to about 20 percent hydrogen ($H_2$) by volume with respect to the total volume of the plasma source gas with the remaining portion of the total volume of the plasma source gas comprising an inert gas.

9. The method of claim 1, wherein the process surface comprises a temperature of about 0° C. to about 450° C. during the hydrogen containing plasma treatment.

10. The method of claim 1, wherein the dielectric insulating layer comprises a material selected from the group of organo-silanes, organo-siloxanes, and organo-cyclo-siloxanes.

11. The method of claim 1, wherein the process surface comprises a temperature of about 0° C. to about 450° C. during the hydrogen containing plasma treatment.

12. The method of claim 1, wherein the material layer is selected from the group consisting of silicon nitride, silicon oxynitride, silicon carbide, and silicon oxycarbide.

13. The method of claim 12, wherein the material layer comprises a bottom anti-reflectance coating (BARC) layer.

14. A method for preventing carbon and nitrogen contamination of an inter-metal dielectric (IMD) layer from an overlying bottom anti-reflective coating (BARC) to improve photolithographic patterning and anisotropic etching of semiconductor feature openings in the IMD layer comprising the steps of:

providing a semiconductor wafer having a process surface comprising an exposed IMD layer;

subjecting the IMD layer to a hydrogen containing plasma treatment prior to forming an overlying BARC layer blanket depositing on the IMD layer the BARC layer selected from the group consisting of a carbon containing BARC and a nitrogen containing BARC; and, forming a patterned photoresist layer on the BARC layer comprising a via opening pattern; and, forming the via opening according to a reactive ion etching (RIE) process through a thickness of the BARC layer and a thickness portion of the IMD layer.

15. The method of claim 14, wherein the nitrogen containing BARC comprises a material selected from the group consisting of silicon nitride, silicon oxynitride, silicon carbide, and silicon oxycarbide.

16. The method of claim 14, wherein the IMD layer is selected form the group consisting of carbon doped oxide (C-oxide), organo-silicate glass (OSG), undoped silicate glass (USG), and fluorinated silicate glass (FSG).

17. The method of claim 14, wherein the step of forming a patterned photoresist layer comprises the use of a chemically amplified photoresist including a photogenerated acid.

18. The method of claim 1, wherein the opening comprises a via opening.

19. The method of claim 1, further comprising forming a second opening overlying the opening to form a dual damascene structure.

20. The method of claim 14, further comprising forming a trench line opening over the via opening to form a dual damascene structure.

21. The method of claim 14, wherein the dielectric insulating layer comprises a material selected from the group of organo-silanes, organo-siloxanes, and organo-cyclo-siloxanes.

22. The method of claim 14, wherein the hydrogen containing plasma treatment comprises operating pressures from about 1 milliTorr to about 10 Torr.

23. The method of claim 22, wherein the hydrogen containing plasma treatment comprises applying an RF power of about 100 Watts to about 500 Watts to maintain the hydrogen plasma.

24. The method of claim 23, wherein the hydrogen containing plasma treatment comprises applying one of an AC and DC bias to the semiconductor wafer having a power of bout 100 Watts to about 400 Watts.

25. The method of claim 23, wherein the hydrogen containing plasma treatment comprises supplying a plasma source gas to including about 5 percent to about 20 percent hydrogen ($H_2$) by volume with respect to the total volume of the plasma source gas with the remaining portion of the total volume of the plasma source gas comprising an inert gas.

* * * * *